United States Patent [19]

Tarn

[11] Patent Number: 5,289,002

[45] Date of Patent: Feb. 22, 1994

[54] OPTICAL SENSOR AND METHOD OF PRODUCTION

[75] Inventor: Terry Tarn, Pittsford, N.Y.

[73] Assignee: Eastman Kodak Company, Rochester, N.Y.

[21] Appl. No.: 979,111

[22] Filed: Nov. 20, 1992

[51] Int. Cl.$^5$ ............................................. H01J 5/02
[52] U.S. Cl. ................................... 250/239; 257/434
[58] Field of Search ............... 250/214.1, 216, 239; 257/433, 434

[56] References Cited

U.S. PATENT DOCUMENTS

| | | | |
|---|---|---|---|
| 3,413,713 | 12/1968 | Helda et al. .......................... | 29/588 |
| 3,605,062 | 9/1971 | Tinkelenberg ................. | 339/17 CF |
| 3,611,061 | 10/1971 | Segerson ......................... | 317/234 R |
| 3,614,546 | 10/1971 | Avins ............................... | 317/234 R |
| 4,032,963 | 6/1977 | Thome .................................. | 357/72 |
| 4,105,861 | 8/1978 | Hascoe ............................. | 174/52 FP |
| 4,129,682 | 12/1978 | Stewart et al. ..................... | 428/571 |
| 4,204,317 | 5/1980 | Winn ..................................... | 29/827 |
| 4,355,719 | 10/1982 | Hinds et al. ........................ | 206/334 |
| 4,727,221 | 2/1988 | Selton et al. .................... | 174/52 FP |
| 4,814,943 | 3/1989 | Okuaki ................................. | 361/400 |
| 4,827,118 | 5/1989 | Shibata et al. ..................... | 257/433 |
| 4,951,119 | 8/1990 | Yonemochi et al. ................. | 357/70 |
| 5,038,248 | 8/1991 | Meyer ................................. | 361/212 |
| 5,216,248 | 6/1993 | Ikeda et al. ...................... | 250/214.1 |

*Primary Examiner*—David C. Nelms
*Attorney, Agent, or Firm*—Raymond L. Owens

[57] ABSTRACT

An optical sensor uses a transparent molded polycarbonate cover to achieve improved quality and reduced cost. The optical sensor includes a CCD supported on a ceramic support plate with leads attached to the support plate and with the polycarbonate cover over the CCD. The cover is shaped like an inverted cup. The base of the cup forms a flat light-transmitting surface and the walls of the cup form a spacer that assures that the light-transmitting surface is held a substantial distance away from the CCD. Any shadows of anomalies on the light-transmitting surface are diffused by the substantial space. The optical sensor is thus made highly resistant to producing false signals. The optical sensors are assembled in a series of operations through which they are passed while interconnected with handling members attached to their respective leads. The handling members are positioned and attached to leave a space directly under the ceramic support plate. This facilitates ease and efficiency of manufacturing and keeps cost down.

7 Claims, 4 Drawing Sheets

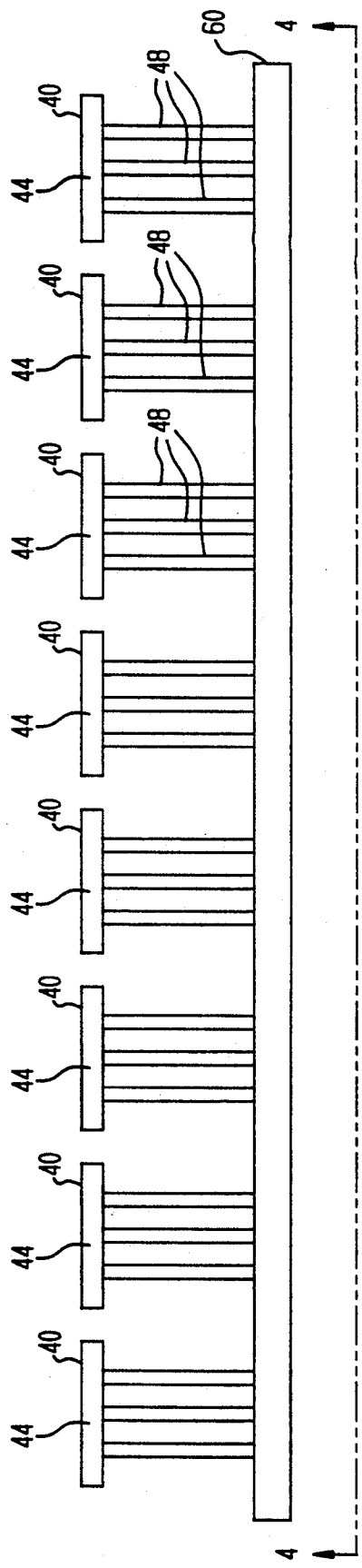
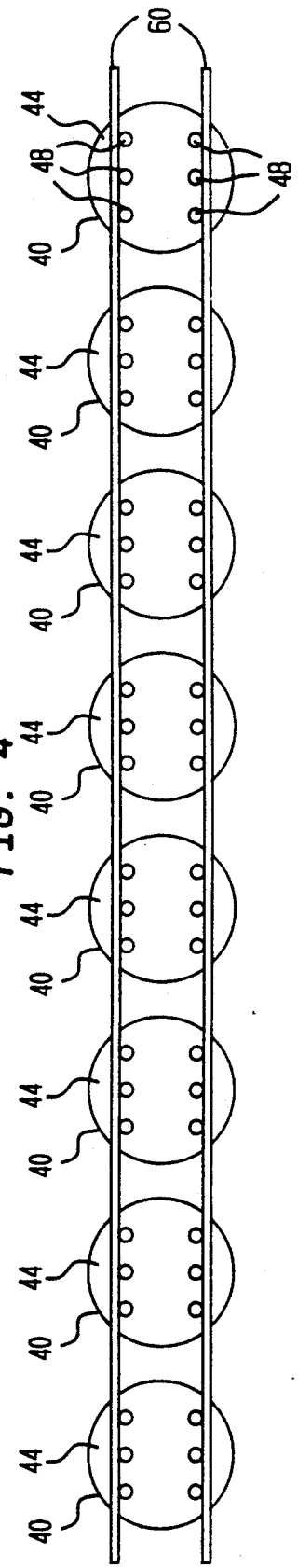

OPTICAL SENSOR AND METHOD OF PRODUCTION

FIELD OF THE INVENTION

The present invention relates to the field of optical sensors.

BACKGROUND OF THE INVENTION

Optical sensors are used in many applications where control of position or detection of movement of an object is required. In some of these applications it is necessary to detect and control very small movements of objects with great accuracy. These applications require the use of very small optical sensors. Typically these very small optical sensors are semiconductor Charge-Coupled Devices (CCD's).

A typical CCD optical sensor is produced in an assembly that includes a support and a protective covering for the CCD, and a set of electrical leads that carry signals from the CCD. The combination of the support, the covering, and the leads is typically referred to as a package.

In the prior art, packages for CCD optical sensors were produced as either ceramic packages or molded packages. A ceramic package was produced by attaching leads to a ceramic disc, bonding the CCD to the ceramic disc and then placing a clear glass cover plate over the CCD to protect it. A molded package was produced by attaching a CCD to a set of leads and then molding a clear plastic housing around the CCD. Each of these prior art assembly techniques leaves something to be desired.

In the case of the molded package, there is a limit on the degree of refinement which is includable in the CCD optical sensor. In some medical and industry applications, a CCD optical sensor must include an integrated polymeric color filter array. These polymeric color filter arrays are not tolerant of the high temperatures encountered in a plastic molding operation. Consequently, a molded package is not a practical option for a CCD optical sensor that is adversely effected by high temperatures.

The prior art ceramic packages also have some shortcomings. A ceramic package must be assembled in a series of steps that requires a great deal of handling and manipulation of the package and its components which tends to increase cost and limit quality. Another problematic aspect of the prior art ceramic package is positioning the clear glass cover in the package. The glass cover is typically displaced at some distance from the CCD in a completed optical sensor. When this displacement distance is small, any imperfection or particle on the glass cover results in a false signal being produced by the optical sensor. As the displacement distance is made larger, there is a reduced likelihood that an anomaly on the glass will produce a false signal. In other words, when an anomaly is kept at a larger distance form the CCD, its deleterious effect is diffused. In prior art ceramic packages there is a practical limit as to the amount of displacement which can be introduced between a CCD and a glass cover on an optical sensor. This can be understood by considering an optical sensor 20 shown in FIG. 1.

Referring now to FIG. 1, there is shown a crosssectional view of a typical prior art optical sensor 20. The optical sensor 20 comprises a device 22, a support member 24, leads 25, and a glass cover 26. The support member 24 comprises a fired ceramic structure that is originally assembled from an unfired support plate 30 and one or more unfired annular rings 32. The support plate 30 and the annular rings 32 are shown as separate objects for purposes of clarity. In fact, the support plate 30 and the annular rings 32 become homogeneous when the support member 24 is fired.

For purposes of illustration, various dimensional references are made on FIG. 1. A letter S designates a distance between a top surface of the device 22 and a bottom surface of the glass cover 26. A letter H designates a height of one of the annular rings 32 and a letter W designates a width of the annular ring 32. It can be seen that the dimension S can be made increasingly large by making the support member 24 from a larger number of the annular rings 32 and by making each of the annular rings 32 with an increasingly large dimension H.

However, in the production of ceramic assemblies there are practical limits on the aspect ratios of various unfired parts that can be assembled into a final product. For example, an unfired annular ring made in accordance with conventional ceramic design rules would have its H and W dimensions approximately equal. This would assure a high yield of dimensionally correct product after firing. The design rule can be stretched to permit a dimension H which is up to 1.5 times the dimension W, but this results in a lower yield after firing and consequently a higher cost for the product.

Additionally, there are practical limits on how many of the annular rings 32 can be used to make one of the support members 24. When one of the annular rings 32 is placed onto one of the support plates 30, there is a certain probability that its position will be off-center. When a second one of the annular rings 32 is placed onto the first annular ring 32, there is a second probability that the second annular ring 32 is off-center relative to the support plate 30. This second probability is larger than the first probability because it is cumulative. Firing of the support plate 30 and the annular rings 32 produces additional dimensional variations that are cumulative with those introduced during assembly. There is a rapid reduction of yield of satisfactory support members 24 as the number of annular rings 32 used in the fabrication increases because of these cumulative probabilities for dimensional error. As a practical limit, it has been found that no more than two of the annular rings 32 can be used to produce one of the support members 24.

It is important to recognize how these ceramic design rules translate into design limitations for optical sensors in the context of small optical sensors, i.e., where the overall diameter or size of the support member 24 is less than about 0.25 inch. In this setting, it is desirable to utilize one of the devices 22 with as much surface area as possible. Thus, the annular rings 32 are made with the dimension W as small as possible, typically about 0.020 inch or smaller. This results in the dimension H of each of the annular rings being about 0.020 inch. A typical one of the devices 22 has a thickness of about 0.020 inch. Thus it can be seen that the dimension S is limited to 0.020 inch or less.

When the dimension S is only 0.020 inch or less, it is critically important to assure that the glass cover 26 is free of imperfections and that its surfaces are absolutely clean. Because of the very high standards needed to assure proper operation of the optical sensors 20, the glass covers 26 are inordinately expensive.

It is desirable therefore to produce an optical sensor with an increased tolerance for imperfections and surface anomalies in its cover. Additionally, it is desirable to produce such an optical sensor with more efficient and less costly manufacturing techniques.

SUMMARY OF THE INVENTION

The present invention is directed to a improved optical sensor in which a transparent cover is formed from molded resin and a light-transmitting surface of the cover is displaced a substantial distance away from a light-receiving surface of a light sensitive device. The large space provides for diffusion of shadows of anomalies on the light-transmitting surfaces and the optical sensor is thus operable with a reduced number of false signals.

Viewed from one aspect, the invention is directed to an optical sensor having a certain overall size. The optical sensor comprises a light sensitive device having a light-receiving surface, a ceramic support plate for supporting the device, a transparent cover having light transmitting surfaces and having supporting walls. The supporting walls are adapted to attach to the support plate. The transparent cover is adapted to maintain its light transmitting surfaces a certain distance from the light-receiving surface of the device. That certain distance is greater than about one tenth of the overall size of the optical sensor.

Viewed from another aspect, the invention is directed to an optical sensor which comprises a light sensitive device having a light-receiving surface, a ceramic support plate for supporting the device, a transparent cover formed from a molded polymeric resin and shaped substantially like an inverted cup. The cover has light transmitting surfaces formed at a base of the cup. The cup is adapted to attach to the support plate with the base of the cup positioned at a distance from the device. The cup has walls that support the base when the cover is in position on the support plate. The walls have a thickness. The cup has a height. The wall thickness is no more than one fifth of the height. Consequently the light transmitting surfaces are maintained a desired distance from the light-receiving surface of the device and a substantial number of shadows of anomalies on the light-transmitting surfaces are diffused to a degree at which they do not produce false signals in the device.

Viewed from still another aspect, the present invention is directed to a method for manufacturing electronic device packages on support plates. The method comprises the steps of attaching a handling member to a set of leads projecting from support plates of a plurality of the electronic device packages, which member is configured to provide access space directly under each of the support plates of the electronic device packages, performing a succession of assembly steps on the electronic device packages while supporting an underside of each of the support plates with a fixture that is adapted to fit through the access space of the handling member, and detaching the handling member from the electronic device packages after all assembly operation are completed.

Viewed from yet another aspect, the invention is directed to a method for manufacturing optical sensors. The method comprises the steps of attaching a first member to a first set of leads of a plurality of the optical sensor along a first side of each of the optical sensors, attaching a second member to a second set of leads of the optical sensors along a second side of each of the optical sensors, performing a succession of assembly steps on the optical sensors while supporting each optical sensor with a fixture that is adapted to fit between the first and second set of leads, and moving each successive one of the attached optical sensors into position on the fixture by lateral movement of the attached optical sensors.

The invention will be better understood from the following detailed description taken in consideration with the accompanying drawings and claims.

BRIEF DESCRIPTION OF THE DRAWINGS

FIG. 3 is an elevation view of a plurality of the optical sensors of FIG. 1 supported on handling bars in accordance with the present invention;

FIG. 4 is a plan view of the optical sensors of FIG. 3 taken along the dashed line 4—4;

The drawings are not necessarily to scale.

DETAILED DESCRIPTION

Figure 2:
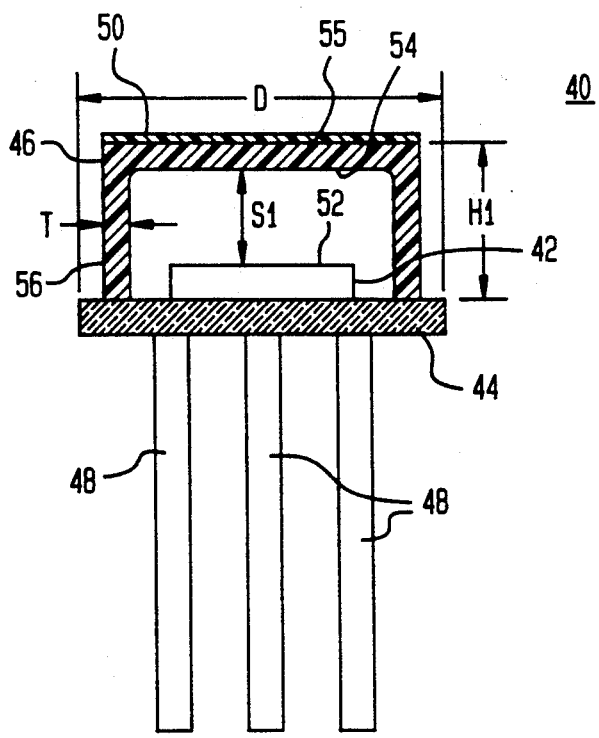
FIG. 2 is a cross sectional view of an optical sensor in accordance with the present invention.

Referring now to FIG. 2, there is shown a cross-sectional view of an optical sensor 40 in accordance with the present invention. The optical sensor 40 comprises a device 42, a support plate 44, a cover 46, leads 48, and a color filter array 50. In a preferred embodiment of the invention illustrated in FIG. 2, the support plate 44 is ceramic, the device 42 is a semiconductor Charge Coupled Device (CCD), the leads 48 are a highly conductive and corrosion resistant metallic alloy such as Kovar, the cover 46 is a high density transparent polymer such as polycarbonate, and the color filter array 50 is formed in a polymer film such as polyethylene terephthalate.

FIG. 2 is shown with various dimensional references. A letter D designates an overall size of the optical sensor 40. A letter S designates a size of a space between a light-receiving surface 52 of the device 42 and a light-transmitting surface 54 of the cover 46. The cover is molded with a substantially uniform thickness. A letter T designates a thickness of a wall 56 of the cover 46 and a distance between the light-transmitting surface 54 and an outer light-transmitting surface 55. A letter H1 designates a height of the cover 46. The support plate 44 is round. Accordingly, the letter D designates a diameter of the support plate 44. In other embodiments of the present invention the support plate 44 may have a rectangular or other non-circular shape. In these cases, the letter D designates, as an overall size, a diagonal distance across a rectangle or other maximum linear distance across whatever geometric shape is selected for the support plate 44.

Figure 1:
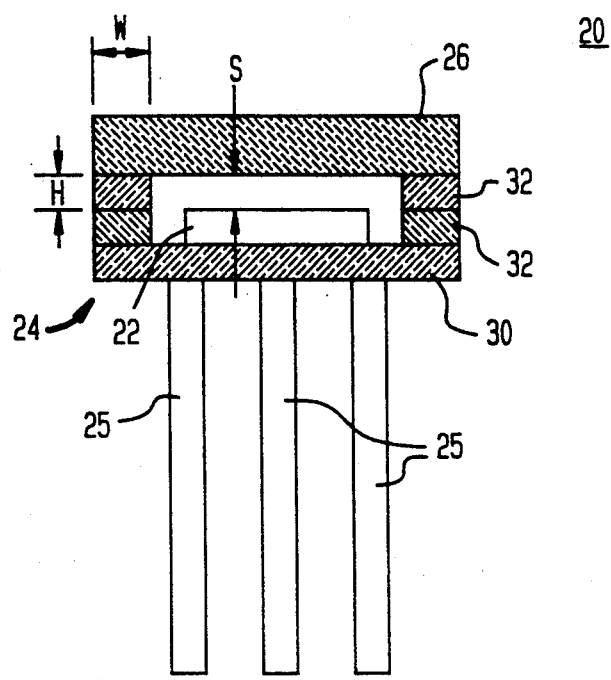
FIG. 1 is cross-sectional view of a prior art optical sensor.

The optical sensor 40 has a substantial advantage over the prior art optical sensor 20 shown in FIG. 1.

Even though the optical sensor 20 and the optical sensor 40 may have the same overall size, the distance S1 in the optical sensor 40 is substantially greater than the distance S in the optical sensor 20. In other words, the cover 46 has its light-transmitting surfaces 54 and 55 a greater distance from the light-receiving surface 52 of the device 42. This is possible because the structure of the optical sensor 40 is not constrained by the ceramic design rules which were discussed hereinabove in the Background of the Invention.

The cover 46 is molded from a transparent polymeric resin. In some respects the cover 46 can be considered to be shaped like an inverted cup, with the light-transmitting surfaces being the base of the cup. The cover 46 is structurally equivalent to the annular rings 32 and the glass cover 26 of FIG. 1. However, a molded resin part such as the cover 46 is producible with a much wider dimensional range than a ceramic part such as the support member 24 of FIG. 1. Thus there is no need to limit the geometry of the cover 46 to the ceramic design rules discussed above.

The geometry of the cover 46 is limited only by design rules that are associated with molded resin parts. Consequently, the cover 46 can be produced with its wall 56 having a thickness of 0.020 inch while its height can be as great as 0.25 inch. In other words, a wall thickness to height ratio of 10 to 1 or greater is completely practical.

The use of the cover 46 on the optical sensor 40 permits a substantial increase in the space S1. The space S1 can be as great as about 0.20 inch when the optical sensor 40 has an overall size of about 0.25 inch. In other words, these two parameters can be substantially equal. In a preferred embodiment of the optical sensor 40, the space S1 is 0.15 inch and the overall size D is 0.25 inch. In other words, the space S1 is greater than one half of the overall size of the overall size D. This is substantially greater than the space S of the prior art optical sensor 20 of FIG. 1 in which the space S is no greater than one tenth of the overall size.

This increase in the space S1, as compared to the corresponding space S in the prior art optical sensor 20 of FIG. 1, results in the optical sensor 40 being a much less expensive and higher quality product. The light-transmitting surfaces 54 of the cover 46 are not required to have the same degree of optical clarity as the glass cover 26 of the prior art optical sensor 20. The need for optical clarity diminishes exponentially as the distance S1 increases. This is because an anomaly or imperfection in the light-transmitting surfaces 54 and 55 is less likely to produce false signals in the device 42 as the distance S1 increases An image or shadow of such an anomaly is diffused when the distance S1 is made large relative to the size of the anomaly. Thus, when the distance S1 increases by a factor of 5 to 10, the need for optical clarity diminishes by a factor of 1000 or more.

It is well known that a light-transmitting surface formed of polymer resin cannot, as a practical matter, be made with optical clarity equal to that of a ground glass surface. Indeed a typical molded resin surface has optical clarity that is 10 times or more worse than the optical clarity of a ground glass surface. However, in the present invention this ostensibly undesirable characteristic of molded resin is more than offset by the increase in the space S1 that is made available with the use of the molded resin cover. The overall net effect of using the molded plastic cover 46 versus the optical sensor 20 of FIG. 1 is reduced cost and improved quality. The molded resin covers 46 are less expensive than the glass covers 26 of FIG. 1. Additionally, the overall yield of the optical sensors 40 is improved because there are fewer false signals generated in the device 42 from optical anomalies on the light-transmitting surfaces 54 and 55 of the cover 46 due to the increase in the spacing S1.

The color filter array 50 is placed on the cover 46 after the cover 46 is molded. Thus the color filter array 50 is not exposed to high molding temperatures that would damage it, as discussed hereinabove in the Background of the Invention. Consequently, it can be seen that the design of the present invention produces a heretofore unavailable option of incorporating an integral color filter array with a molded resin cover on an optical sensor.

Referring now to FIGS. 3 and 4, there are shown a side view (FIG. 3) and a bottom view (FIG. 4) taken along a dashed line 4—4 of FIG. 3 of a plurality of the optical sensors 40 of FIG. 2 in a partially completed state. The optical sensors 40 are shown only with their respective support plates 44 and leads 48 assembled. All other parts of the optical sensors 40 are not shown for purposes of clarity. Each of the leads 48 is attached to one of a set of handling bars 60. Each of the handling bars 60 is comprised of a strip of Kovar that has a cross-sectional area of about 0.20 inch by 0.10 inch. As shown in FIGS. 3 and 4, there are eight of the optical sensors 40 attached to each set of the handling bars 60.

In operation, the handling bars 60 greatly facilitate production of the optical sensors 40. The handling bars are attached, by conventional brazing, to the leads 48 when the leads are assembled with the support plates 44. The handling bars 60 remain attached to the leads 48 throughout all subsequent assembly operations performed on the optical sensors 40. The handling bars 60 are removed after the optical sensors 40 are completely assembled.

Typically, the optical sensors 40 undergo a series of discreet assembly operations. The devices 42 of FIG. 2 are adhesively bonded to the support plates 44 of FIG. 2 in one operation. Wire bonding between the devices 42 of FIG. 2 and the leads 48 is performed in another operation. The covers 46 of FIG. 2 are adhesively bonded to the support plates 44 of FIG. 2 in still another operation. In each of these operations there is a requirement that the optical sensors 40 are held rigidly and in proper alignment with various tools. The handling bars 60 facilitate this alignment and handling.

To assure manufacturing accuracy, all of the above mentioned operations are performed on fixtures (not shown) which support the support plates 44 from the underside, i.e., the side opposite that on which the device 42 is attached. The handling bars 60 are attached to the optical sensors 40 in sets so that this manufacturing technique can be accommodated. A first one of the handling bars 60 is attached to three of the leads 48 of each of the optical sensors 40. A second one of the handling bars 60 is attached to another set of three of the leads 48 of each of the optical sensors 40. The handling bars 60 are displaced from one another so that each of the support plates 44 can be supported from its underside during each assembly operation. The use of the handling bars 60 attached to a plurality of the optical sensors 40 allows a manufacturing to proceed without cumbersome individual handling of each of the small optical sensors 40. Use of two of the handling bars 60 displaced from each other as a set allows a manufacturing operation to proceed accurately and efficiently without concern for interference of the handling bars 60 with proper underside support of the support plates 44 during each assembly operation. These points can be better understood by referring to FIGS. 5 and 6.

Figure 5:
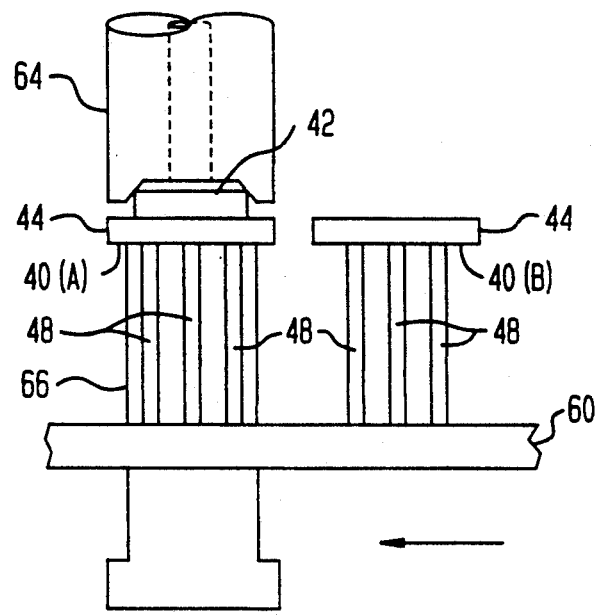
FIG. 5 is a view of one step of an assembly operation of the optical sensors of FIG. 1 in accordance with the present invention.

Referring now to FIG. 5, there is shown next step in a typical assembly operation of one of the optical sensors 40, designated in FIG. 5 as 40(A). The illustrated assembly operation is a placement of one of the devices 42 onto one of the support plates 44. A vacuum collet 64 places one of the devices 42 at a desired location on one of the support plates 44 while the support plate 44 is held in position by a fixture 66. The fixture 66 bears against the underside of the support plate 44 of the optical sensor 40(A) during the assembly step. A second one of the optical sensors 40, designated as 40(B), is in position to be moved into the assembly position after work has been completed on the optical sensor 40(A).

Figure 6:
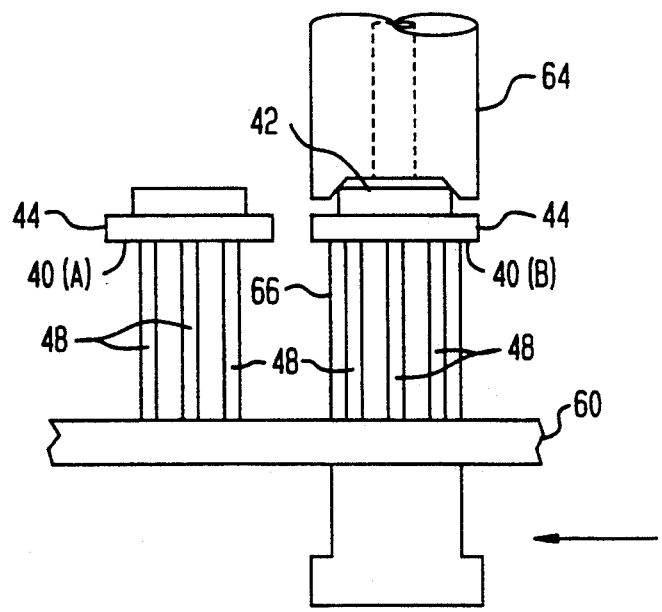
FIG. 6 is a view of the assembly step of FIG. 5 being performed on a subsequent one of the optical sensors.

Referring now to FIG. 6, there is shown a subsequent step in a series of assembly operations being performed on a plurality of the optical sensors 40 which are attached to one set of the handling bars 60. The optical sensor 40(A) is displaced laterally to the left of the fixture 66 and the optical sensor 40(B) is in position over the fixture 66. The vacuum collet 64 is shown placing one of the devices 42 onto the support plate 44 of the optical sensor 40(B). It can be seen that the configuration of the handling bars 60 and their positioning on the leads 48 provides for a uniquely efficient method of assembling the optical sensors 40. Each of the optical sensors 40 can be successively moved into position in a manufacturing step by simply imparting a lateral motion to the handling bars 60. This ability to move a series of the optical sensors 40 through a manufacturing operation with simple lateral motions produces desirable efficiency and results in improved quality of the product. There is no need to pick up and handle each of the individual optical sensors 40. Additionally there is no need to make cumbersome alignments of individual optical sensors 40 at each assembly operation.

Figure 7:
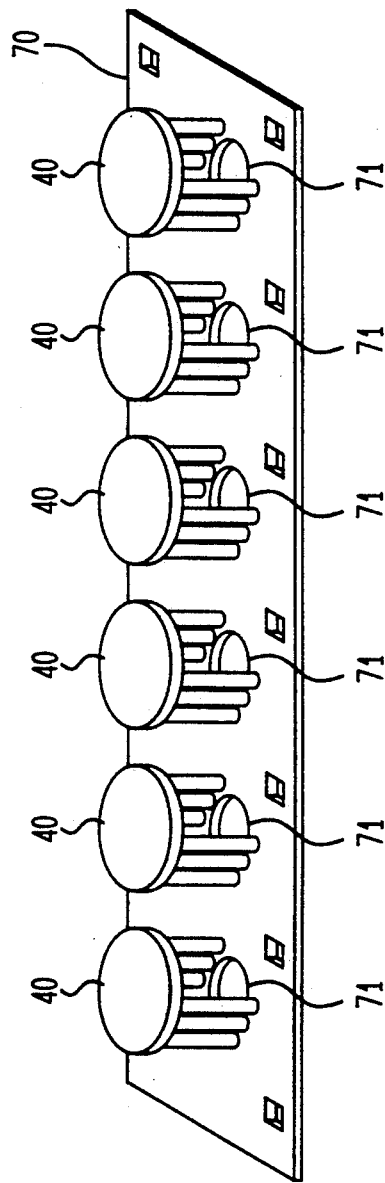
FIG. 7 is a perspective view of a plurality of the optical sensors of FIG. 1 supported on a handling member in accordance with the present invention.

Referring now to FIG. 7, there is shown another method of assembling optical sensors in accordance with the present invention. FIG. 7 shows a plurality of partially assembled optical sensors 40 attached to a handling member 70. The handling member 70 is a metallic strip which is formed in an etching operation. The handling member 70 has a plurality of access holes 71 therein. Each of the access holes 71 is aligned with an underside of one of the support plates 44 of one of the partially assembled optical sensors 40. The access holes 71 permit the performance of various assembly operations (not shown) on the optical sensors 40 while each of the support plates 44 is supported on its respective underside by a support fixture (not shown). After all assembly of the optical sensors 40 is complete, the handling member 70 is removed. The employment of the handling member 70 produces desirable efficiency and improved quality of the product. There is no need to pick up and handle each of the individual optical sensors 40. Additionally, there is no need to make cumbersome alignments of individual optical sensors 40 at each assembly operation.

It is to be appreciated and understood that the specific embodiments of the invention are merely illustrative of the general principles of the invention. Various modifications may be made by those skilled in the art which are consistent with the principles set forth. For example, optical sensors of various sizes can be beneficially produced using the design principles set forth herein. Furthermore, the package described herein applicable to optical sensors that are not based on semiconductor light sensitive devices. Still further, the method described herein is applicable to assembly of many different types of small electronic devices, not necessarily optical sensors.

What is claimed is:

1. An optical sensor having a certain overall size comprising;
   a light sensitive device having a light-receiving surface;
   a support plate for supporting the device;
   a transparent cover having inner and outer light transmitting surfaces and having supporting walls adapted to attach to the support plate;
   the supporting walls being adapted to maintain the inner and outer light transmitting surfaces of the cover preselected distances from the light-receiving surface of the device; and
   the preselected distance between the inner light transmitting surface and said light receiving surface being greater than about one tenth of the overall size of the optical sensor.

2. The optical sensor of claim 1 wherein the distance between the inner light transmitting surfaces of the transparent cover and the light-receiving surface of the device is greater than about one half of the overall size of the optical sensor.

3. The optical sensor of claim 1 wherein the distance between the inner light transmitting surface of the transparent cover and the light-receiving surface of the device is substantially equal to the overall size of the optical sensor.

4. The optical sensor of claim 1 wherein:
   the transparent cover is molded plastic member having attachment walls with a certain thickness and having inner and outer light transmitting surfaces aligned substantially orthogonally with the attachment walls; and
   the attachment walls have a height that is at least about ten times their thickness.

5. The optical sensor of claim 4 wherein at least one of the light transmitting surfaces of the molded plastic member is covered with a polymeric color filter array.

6. An optical sensor comprising;
   a light sensitive device having a light-receiving surface;
   a ceramic support plate for supporting the device;
   a transparent cover formed from a molded polymeric resin and shaped substantially like an inverted cup;
   the cover having inner and outer light transmitting surfaces formed at a base of the cup and being adapted to attach to the support plate with the base of the cup positioned at a distance from the device;
   the cup having walls that support the base when the cover is in position on the support plate;
   the walls having a thickness;
   the cup having a height; and
   the wall thickness being no more than one fifth of the height whereby the inner and outer light transmitting surfaces are maintained at desired distances from the light-receiving surface of the device and a substantial number of shadows of any anomalies on said inner and outer light-transmitting surfaces are diffused to a point at which they do not produce false signals in the device.

7. An optical sensor comprising:

a light sensitive device;

a transparent molded polymeric cover for the light sensitive device;

the cover having inner and outer light transmitting surfaces having a deficiency of optical clarity relative to ground glass and aligned substantially parallel to a light-receiving surface of the device:

the cover having a polymeric color filter array attached to at least one of its lights-transmitting surfaces;

the light transmitting surfaces of the cover being displaced from the light-receiving surface of the device by an amount which is sufficient to compensate for said deficiency, said amount being a function of the optical clarity of said light transmitting surfaces relative to the optical clarity of ground glass.

* * * * *